(12) United States Patent
Dierickx

(10) Patent No.: US 7,750,958 B1
(45) Date of Patent: Jul. 6, 2010

(54) PIXEL STRUCTURE

(75) Inventor: Bart Dierickx, Edegem (BE)

(73) Assignee: Cypress Semiconductor Corporation, San Jose, CA (US)

( * ) Notice: Subject to any disclaimer, the term of this patent is extended or adjusted under 35 U.S.C. 154(b) by 843 days.

(21) Appl. No.: 11/366,926

(22) Filed: Mar. 1, 2006

Related U.S. Application Data

(60) Provisional application No. 60/666,124, filed on Mar. 28, 2005.

(51) Int. Cl.
*H04N 5/335* (2006.01)
*H01L 27/00* (2006.01)
*H01L 31/062* (2006.01)

(52) U.S. Cl. .................. 348/294; 250/208.1; 257/290

(58) Field of Classification Search .............. 348/213, 348/7, 250, 281, 294, 301, 302, 308; 257/290–292
See application file for complete search history.

(56) References Cited

U.S. PATENT DOCUMENTS

| | | | |
|---|---|---|---|
| 3,770,968 A | 11/1973 | Hession et al. | |
| 3,904,818 A | 9/1975 | Kovac | |
| 4,148,048 A | 4/1979 | Takemoto et al. | |
| 4,253,120 A | 2/1981 | Levine | |
| 4,373,167 A | 2/1983 | Yamada | |
| 4,389,661 A | 6/1983 | Yamada | |
| 4,473,836 A | 9/1984 | Chamberlain | |
| 4,484,210 A | 11/1984 | Shiraki et al. | |
| 4,498,013 A | 2/1985 | Kuroda et al. | |
| 4,565,756 A | 1/1986 | Needs et al. | |
| 4,580,103 A | 4/1986 | Tompsett | |
| 4,630,091 A | 12/1986 | Kuroda et al. | |
| 4,647,975 A | 3/1987 | Alston et al. | |
| 4,696,021 A | 9/1987 | Kawahara | |
| 4,703,169 A | 10/1987 | Arita | |
| 4,774,557 A | 9/1988 | Kosonocky | |
| 4,814,848 A | 3/1989 | Akimoto et al. | |
| 4,831,426 A | 5/1989 | Kimata et al. | |
| 4,914,493 A | 4/1990 | Shiromizu | |
| 4,951,105 A | 8/1990 | Yamada | |
| 4,984,044 A | 1/1991 | Yamamura | |

(Continued)

FOREIGN PATENT DOCUMENTS

CA 2132629 A1 9/1993

(Continued)

OTHER PUBLICATIONS

Orly Yadid-Pecht et al., "A Random Access Photodiode Array for Intelligent Image Capture", IEEE Transactions on Electron Devices, vol. 38, No. 8, Aug. 1991, pp. 1772-1780.

(Continued)

*Primary Examiner*—Nhan T Tran
*Assistant Examiner*—Trung Diep

(57) ABSTRACT

A method is disclosed for applying a first voltage to a back plate of a memory capacitor of a pixel to discharge the memory capacitor, pre-charging the memory capacitor in the pixel by applying the first voltage to a source of a pre-charge transistor while applying the first voltage to the back plate of the memory capacitor, and applying a second voltage to the back plate of the memory capacitor and the source of the pre-charge transistor, wherein the second voltage is at a higher potential than the first voltage to generate a negative gate-to-source voltage in the pre-charge transistor.

13 Claims, 4 Drawing Sheets

U.S. PATENT DOCUMENTS

| | | | |
|---|---|---|---|
| 4,984,047 A | 1/1991 | Stevens | |
| 4,998,265 A | 3/1991 | Kimata | |
| 5,084,747 A | 1/1992 | Miyawaki | |
| 5,101,253 A | 3/1992 | Mizutani et al. | |
| 5,128,534 A | 7/1992 | Wyles et al. | |
| 5,144,447 A | 9/1992 | Akimoto et al. | |
| 5,146,074 A | 9/1992 | Kawahara et al. | |
| 5,153,420 A | 10/1992 | Hack et al. | |
| 5,164,832 A | 11/1992 | Halvis et al. | |
| 5,182,623 A | 1/1993 | Hynecek | |
| 5,191,398 A | 3/1993 | Mutoh | |
| 5,258,845 A | 11/1993 | Kyuma et al. | |
| 5,283,428 A | 2/1994 | Morishita et al. | |
| 5,296,696 A | 3/1994 | Uno | |
| 5,307,169 A | 4/1994 | Nagasaki et al. | |
| 5,321,528 A | 6/1994 | Nakamura | |
| 5,329,112 A | 7/1994 | Mihara | |
| 5,335,008 A | 8/1994 | Hamasaki | |
| 5,436,949 A | 7/1995 | Hasegawa et al. | |
| 5,461,425 A | 10/1995 | Fowler et al. | |
| 5,496,719 A | 3/1996 | Miwada | |
| 5,519,207 A | 5/1996 | Morimoto | |
| 5,528,643 A | 6/1996 | Hynecek | |
| 5,576,763 A | 11/1996 | Ackland et al. | |
| 5,578,842 A | 11/1996 | Shinji | |
| 5,587,596 A | 12/1996 | Chi et al. | |
| 5,608,204 A | 3/1997 | Hofflinger et al. | |
| 5,608,243 A | 3/1997 | Chi et al. | |
| 5,614,744 A | 3/1997 | Merrill | |
| 5,625,210 A | 4/1997 | Lee et al. | |
| 5,668,390 A | 9/1997 | Morimoto | |
| 5,675,158 A | 10/1997 | Lee | |
| 5,710,446 A | 1/1998 | Chi et al. | |
| 5,714,753 A | 2/1998 | Park | |
| 5,721,425 A | 2/1998 | Merrill | |
| 5,754,228 A | 5/1998 | Dyck | |
| 5,786,607 A | 7/1998 | Ishikawa et al. | |
| 5,812,191 A | 9/1998 | Orava et al. | |
| 5,828,091 A | 10/1998 | Kawai | |
| 5,841,126 A | 11/1998 | Fossum | |
| 5,841,159 A | 11/1998 | Lee et al. | |
| 5,861,621 A | 1/1999 | Takebe et al. | |
| 5,872,371 A | 2/1999 | Guidash et al. | |
| 5,872,596 A | 2/1999 | Yanai | |
| 5,886,353 A | 3/1999 | Spivey et al. | |
| 5,898,168 A | 4/1999 | Gowda et al. | |
| 5,898,196 A | 4/1999 | Hook et al. | |
| 5,903,021 A | 5/1999 | Lee et al. | |
| 5,904,493 A | 5/1999 | Lee et al. | |
| 5,933,190 A | 8/1999 | Dierickx | |
| 5,952,686 A | 9/1999 | Chou et al. | |
| 5,953,060 A | 9/1999 | Dierickx | |
| 5,955,753 A | 9/1999 | Takahashi | |
| 5,956,570 A | 9/1999 | Takizawa | |
| 5,973,375 A | 10/1999 | Baukus et al. | |
| 5,977,576 A | 11/1999 | Hamasaki | |
| 5,990,948 A | 11/1999 | Sugiki | |
| 6,011,251 A | 1/2000 | Dierickx et al. | |
| 6,040,592 A | 3/2000 | McDaniel et al. | |
| 6,043,478 A * | 3/2000 | Wang | 250/208.1 |
| 6,051,857 A | 4/2000 | Miida | |
| 6,100,551 A | 8/2000 | Lee et al. | |
| 6,100,556 A | 8/2000 | Drowley et al. | |
| 6,107,655 A | 8/2000 | Guidash | |
| 6,111,271 A | 8/2000 | Snyman et al. | |
| 6,115,066 A | 9/2000 | Gowda et al. | |
| 6,133,563 A | 10/2000 | Clark et al. | |
| 6,133,954 A | 10/2000 | Jie et al. | |
| 6,136,629 A | 10/2000 | Sin | |
| 6,137,100 A | 10/2000 | Fossum et al. | |
| 6,166,367 A | 12/2000 | Cho | |
| 6,188,093 B1 | 2/2001 | Isogai et al. | |
| 6,194,702 B1 | 2/2001 | Hook et al. | |
| 6,204,524 B1 | 3/2001 | Rhodes | |
| 6,225,670 B1 | 5/2001 | Dierickx | |
| 6,239,456 B1 | 5/2001 | Berezin et al. | |
| 6,316,760 B1 | 11/2001 | Koyama | |
| 6,459,077 B1 | 10/2002 | Hynecek | |
| 6,545,303 B1 | 4/2003 | Scheffer | |
| 6,570,618 B1 | 5/2003 | Hashi | |
| 6,631,217 B1 * | 10/2003 | Funatsu et al. | 382/307 |
| 6,636,261 B1 * | 10/2003 | Pritchard et al. | 348/308 |
| 6,778,214 B1 | 8/2004 | Toma | |
| 6,812,539 B1 | 11/2004 | Rhodes | |
| 6,815,791 B1 | 11/2004 | Dierickx | |
| 6,825,455 B1 | 11/2004 | Schwarte | |
| 6,836,291 B1 | 12/2004 | Nakamura et al. | |
| 6,906,302 B2 | 6/2005 | Drowley | |
| 6,975,356 B1 * | 12/2005 | Miyamoto | 348/308 |
| 7,199,410 B2 | 4/2007 | Dierickx | |
| 7,230,289 B2 | 6/2007 | Komori | |
| 7,253,019 B2 | 8/2007 | Dierickx | |
| 7,402,881 B2 | 7/2008 | Kuwazawa | |
| 7,557,845 B2 | 7/2009 | Kuwazawa | |
| 2002/0022309 A1 | 2/2002 | Dierickx | |
| 2003/0011694 A1 | 1/2003 | Dierickx | |
| 2007/0145503 A1 | 6/2007 | Dierickx | |

FOREIGN PATENT DOCUMENTS

| | | |
|---|---|---|
| EP | 0260954 A1 | 3/1988 |
| EP | 0548987 A1 | 6/1993 |
| EP | 0635973 A1 | 1/1995 |
| EP | 0657863 A1 | 6/1995 |
| EP | 0739039 A1 | 10/1996 |
| EP | 0773669 A1 | 5/1997 |
| EP | 0632930 A1 | 7/1998 |
| EP | 0858111 A1 | 8/1998 |
| EP | 0858212 A1 | 8/1998 |
| EP | 0883187 A1 | 12/1998 |
| EP | 0903935 A1 | 3/1999 |
| EP | 0978878 A1 | 2/2000 |
| GB | 2324651 A1 | 10/1998 |
| JP | 01-204579 A1 | 8/1989 |
| JP | 02-050584 A1 | 2/1990 |
| JP | 04088672 A1 | 3/1992 |
| JP | 04-207589 A1 | 7/1992 |
| JP | 05-030433 A1 | 2/1993 |
| JP | 06-284347 A1 | 10/1994 |
| JP | 07-072252 A1 | 3/1995 |
| JP | 09321266 A1 | 12/1997 |
| JP | 11-313257 A1 | 9/1999 |
| WO | 9304556 A1 | 3/1993 |
| WO | 9319489 A1 | 9/1993 |
| WO | 9810255 A1 | 3/1998 |
| WO | 9916268 A1 | 4/1999 |
| WO | WO 99/30368 | 6/1999 |
| WO | 0055919 A1 | 9/2000 |

OTHER PUBLICATIONS

J. Bogaerts et al., "High-end CMOS Active Pixel Sensor for Hyperspectral Imaging", 2005 IEEE Workshop on Charge-Coupled Devices and Advanced Image Sensors, R11, pp. 39-43, Jun. 9-11, 2005, Karuizawa Prince Hotel, Karuizawa, Nagano, Japan.

U.S. Appl. No. 09/906,418: "Method to Adjust the Signal Level of an Active Pixel and Corresponding Active Pixel," Bart Dierickx, filed on Jul. 16, 2001; 15 pages.

USPTO Miscellaneous Action for U.S. Appl. No. 09/906,418 dated Mar. 2, 2007; 3 pages.

USPTO Notice of Allowance for U.S. Appl. No. 09/906,418 dated Feb. 1, 2007 6 pages.

USPTO Non-Final Rejection for U.S. Appl. No. 09/906,418 dated Oct. 6, 2005; 9 pages.

USPTO Final Rejection for U.S. Appl. No. 09/906,418 dated Jun. 15, 2005; 11 pages.
USPTO Non-Final Rejection for U.S. Appl. No. 09/906,418 dated Feb. 28, 2005; 12 pages.
German Search Report for German Patent Application 102 31 082.3 filed on Jul. 10, 2002; 4 pages
European Search Report for Application No. 01204595.1-2203 dated Nov. 28, 2005; 8 pages.
Partial European Search Report, European Patent Office, Sep. 28, 2005, Application No. 01204595.1-2203; 4 pages.
Stefan Lauxtermann et al., "A High Speed CMOS Imager Acquiring 5000 Frames/Sec," IEDM 99, 0-7803-5410-9/99, 1999 IEEE, pp. 875-878; 4 pages.
Aw et al., "A 128x128-Pixel Standard-CMOS Image Sensor with Electronic Shutter," ISSCC96/Session 11/Electronic Imaging Circuits/Paper FA 11.2, 1996 IEEE International Solid-State Circuits Conference, pp. 180-181 and 440; 3 pages.
Patent Abstracts of Japan Publication No. JP 59-67791, publication date Apr. 17, 1984; 1 page.
Aoki et al., "A Collinear 3-Chip Image Sensor," IEEE International Solid-State Circuits Conference, 1985, pp. 102-103; 3 pages.
Horil et al., "A 490 x 404 Element Imager for a Single-Chip Color Camera," IEEE International Solid-State Circuits Conference, 1985, pp. 96-97; 2 pages.
Nagakawa et al., "A 580 x 500-Element CCD Imager with a Shallow Flat P Well," IEEE International Solid-State Circuits Conference, 1985, pp. 98-99; 2 pages.
Mahowald, "Silicon Retina with Adaptive Photoreceptors," SPIE, vol. 1473, 1991, pp. 52-58; 7 pages.
Mann, "Implementing Early Visual Processing in Analog VLSI: Light Adaptation," SPIE, vol. 1473, 1991, pp. 128-136; 10 pages.
Ono at al., "Analysis of Smear Noise in Interine-CCD Image Sensor with Gate-Free Isolation Structure," Abstract of the 1991 International Conference on Solid State Devices and Materials, Yokohama, 1991, pp. 68-70; 6 pages.
Yadid-Pecht at al., "A Random Access Photodiode Array for Intelligent Image Capture," IEEE Transactions on Electron Devices, vol. 38, No. 8, Aug. 1991, pp. 1772-1780; 9 pages.
Ricquier et al., "Pixel Structure with Logarithmic Response for Intelligent and Flexible Imager Architectures," Microelectronic Engineering, 1992, pp. 631-634; 4 pages.
Sevenhans et al., "A 400mm Long Linear X-Ray Sensitive Image Sensor," IEEE International Solid-State Circuits Conference, 1987, pp. 108-109; 4 pages.
Anderson et al., "A Single Chip Sensor & Image Processor of Fingerprint Verification," IEEE 1991 Custom Integrated Circuits Conference, May 12-15, 1991; pp. 12.1.1-12.1.4; 4 pages.
Bart Dierickx, "XYW Detector: A Smart Two-Dimensional Particle Sensor," Nuclear Instruments and Methods in Physics Research A275, North-Holland Physics Publishing Division, 1989, pp. 542-544; 3 pages.
Klein, "Design and Performance of Semiconductor Detectors with Integrated Amplification and Charge Storage Capability," Nuclear Instruments and Methods in Physics Research A305, 1991, pp. 517-526; 11 pages.
Martin et al., "Dynamic Offset Null," IBM Technical Disclosure Bulletin, No. 23, No. 9, Feb. 1981, pp. 4195-4196; 2 pages.
USPTO Advisory Action for U.S. Appl. No. 09/736,651 dated Jun. 11, 2003; 3 pages.
USPTO Non-Final Rejection for U.S. Appl. No. 09/736,651 dated Sep. 11, 2002; 5 pages.
USPTO Final Rejection for U.S. Appl. No. 09/736,651 dated Apr. 7, 2003; 6 pages.
USPTO Miscellaneous Action for U.S. Appl. No. 09/460,630 dated Aug. 16, 2004; 2 pages.
USPTO Notice of Allowance for U.S. Appl. No. 09/460,630 dated Feb. 27, 2004; 6 pages.
USPTO Non-Final Rejection for U.S. Appl. No. 09/460,630 dated Aug. 14, 2003; 6 pages.
USPTO Final Rejection for U.S. Appl. No. 09/460,630 dated Jan. 24, 2003; 9 pages.
USPTO Non-Final Rejection for U.S. Appl. No. 09/460,630 dated Jun. 10, 2002; 5 pages.
USPTO Final Rejection for U.S. Appl. No. 09/460,630 dated Dec. 6, 2001; 6 pages.
USPTO Non-Final Rejection for U.S. Appl. No. 09/460,630 dated May 23, 2001; 7 pages.
USPTO Requirement for Restriction/Election for U.S. Appl. No. 09/460,630 dated Mar. 21, 2001; 4 pages.
USPTO Miscellaneous Action for U.S. Appl. No. 09/460,630 dated Feb. 1, 2000; 1 page.
USPTO Notice of Allowance for U.S. Appl. No. 10/984,485 dated Apr. 9, 2007; 7 pages.
USPTO Non-Final Rejection for U.S. Appl. No. 10/984,485 dated Nov. 15, 2006; 8 pages.
USPTO Final Rejection for U.S. Appl. No. 11/707,723 dated Apr. 14, 2008; 9 pages.
USPTO Non-Final Rejection for U.S. Appl. No. 11/707,723 dated Oct. 15, 2007; 5 pages.
USPTO Requirement for Restriction/Election for U.S. Appl. No. 11/707,723 dated Aug. 28, 2007; 5 pages.
USPTO Notice of Allowance for U.S. Appl. No. 09/736,651 dated Nov. 29, 2006; 7 pages.
USPTO Non-Final Rejection for U.S. Appl. No. 09/736,651 dated Jul. 12, 2006; 6 pages.
USPTO Non-Final Rejection for U.S. Appl. No. 09/736,651 dated Mar. 9, 2006; 8 pages.
USPTO Advisory Action for U.S. Appl. No. 09/736,651 dated Dec. 12, 2005; 3 pages.
USPTO Final Rejection for U.S. Appl. No. 09/736,651 dated Sep. 19, 2005; 7 pages.
USPTO Non-Final Rejection for U.S. Appl. No. 09/736,651 dated Apr. 8, 2005; 7 pages.
USPTO Advisory Action for U.S. Appl. No. 09/736,651 dated Feb. 24, 2005; 3 pages.
USPTO Final Rejection for U.S. Appl. No. 09/736,651 dated Nov. 17, 2004; 6 pages.
USPTO Non-Final Rejection for U.S. Appl. No. 09/736,651 dated Jun. 2, 2004; 7 pages.
USPTO Advisory Action for U.S. Appl. No. 09/736,651 dated Apr. 19, 2004; 3 pages.
USPTO Final Rejection for U.S. Appl. No. 09/736,651 dated Feb. 4, 2004; 7 pages.
USPTO Non-Final Rejection for U.S. Appl. No. 09/736,651 dated Aug. 20, 2003; 6 pages.
USPTO Requirement for Restriction/Election for U.S. Appl. No. 09/021,010 dated Aug. 24, 1998; 3 pages.
USPTO Non-Final Rejection for U.S. Appl. No. 09/021,010 dated Oct. 1, 1999; 1 pages.
USPTO Non-Final Rejection for U.S. Appl. No. 09/021,010 dated Apr. 25, 2000; 3 pages.
USPTO Requirement for Restriction/Election for U.S. Appl. No. 09/736,651 dated Jul. 15, 2002; 4 pages.
USPTO Notice of Allowance for U.S. Appl. No. 09/021,010 dated Nov. 6, 2000; 2 pages.
USPTO Requirement for Restriction for U.S. Appl. No. 08/635,035 dated Mar. 5, 1998; 5 pages.
USPTO Non-Final Rejection for U.S. Appl. No. 08/635,035 dated Jun. 1, 1998; 7 pages.
USPTO Notice of Allowance for U.S. Appl. No. 08/635,035 dated Nov. 24, 1998; 2 pages.
U.S. Appl. No. 12/148,915: "Six Transistor (6T) Pixel Architecture," Yannick De Wit, filed on Apr. 22, 2008; 21 pages.
Witters et al., "1024 x 1280 Pixel Dual Shutter APS for Industrial Vision," Sensors and Camera Systems for Scientific, Industrial, and Digital Photography Applications IV, Proceedings of SPIE-IS&T Electronic Imaging, SPIE vol. 5017, Jan. 2003, pp. 19-23; 5 pages.
Recontres de Technologies Spatiales, "Systemes lmageurs A Haute Resolution (OT1), Developpement d'un demonstrateur de detecteur APS <<snapshot>>," Toulouse, Oct. 2006, pp. 1-16; 16 pages.
Dierickx et al., "NIR-Enhanced Image Sensor Using Multiple Epitaxial Layers," Sensors and Camera Systems for Scientific, Industrial, and Digital Photography Applications IIndustrial, and Digital Photography Applications V, Proceedings of SPIE-IS&T Electronic Imaging, SPIE vol. 5301, Jan. 2004, pp. 205-212; 8 pages.

* cited by examiner

PIXEL STRUCTURE

REFERENCE TO RELATED APPLICATION

This application claims the benefit of U.S. Provisional Application No. 60/666,124, filed on Mar. 28, 2005.

TECHNICAL FIELD

The present invention relates generally to an image sensor and, more particularly, to a pixel structure used in an image sensor.

BACKGROUND

Solid-state image sensors have found widespread use in camera systems. The solid-state imager sensors in some camera systems are composed of a matrix of photosensitive elements in series with switching and amplifying elements. The photosensitive sensitive elements may be, for example, photoreceptors, photo-diodes, phototransistors, charge-coupled device (CCD) gate, or alike. Each photosensitive element receives an image of a portion of a scene being imaged. A photosensitive element along with its accompanying electronics is called a picture element or pixel. The image obtaining photosensitive elements produce an electrical signal indicative of the light intensity of the image. The electrical signal of a photosensitive element is typically a current, which is proportional to the amount of electromagnetic radiation (light) falling onto that photosensitive element.

Of the image sensors implemented in a complementary metal-oxide-semiconductor (CMOS)- or MOS-technology, image sensors with passive pixels and image sensors with active pixels are distinguished. The difference between these two types of pixel structures is that an active pixel amplifies the charge that is collect on its photosensitive element. A passive pixel does not perform signal amplification and requires a charge sensitive amplifier that is not integrated in the pixel.

FIG. 1A illustrates one embodiment of a conventional pixel structure used within a synchronous shutter image sensor. A synchronous shutter image sensor is used to detect the signal of all the pixels within the array at (approximately) the same time. This is in contrast to an asynchronous shutter image sensor that may be implemented with a 3T (three transistor) or 4T (four transistor) pixel structure that does not include a sample and hold stage. Such an asynchronous shutter image sensor outputs the state of a pixel at the moment of read out. This gives movement artifacts because every pixel in the array is not sensing a scene at the same moment.

The pixel structure of FIG. 1A that is used in a synchronous shutter image sensor includes a light detecting stage and a sample and hold stage. The light detecting stage includes a photodiode, a reset transistor and a reset buffer (e.g., a unity gain amplifier). The sample and hold stage includes a sample transistor, one or more memory capacitors (represented by the capacitor C in FIG. 1A), a sample buffer and a multiplexer, i.e., switch or select transistor coupled to a column output of the pixel array.

FIG. 1B illustrates one conventional circuit configuration of the synchronous pixel of FIG. 1A. The reset transistor of the light detecting stage is used to reset the pixel to a high value, and then the voltage on the gate of the source follower transistor M1 starts dropping due to the photocurrent generated in the photodiode. The source follower transistor M1 operates as a unity gain amplifier to buffer the signal from the photodiode. The sample and hold (S&H) stage of FIG. 1B "sample" loads the voltage signal of source follower transistor M1, through the sample transistor, on the memory capacitor (Cmem). The voltage signal from the source follower transistor MI will remain on the memory capacitor when the sample transistor is turned off.

Before that, however, the switch, or pre-charge, transistor briefly unloads the Cmem capacitor. The voltage (Vmem) applied to the back plate of Cmem may be a fixed voltage, but in practice, a varying voltage for Vmem may help to shift the voltage on the memory node, so as to drive the source follower transistor M2 in a more suitable regime. A potential problem with the pixel structure illustrated in FIG. 1B is with respect to current leakage that may cause a loss of stored information. In particular, the sample capacitor Cmem charge may leak to ground (GND) through the pre-charge transistor. For the pixel shown in FIG. 1B, when the pre-charge transistor is off, this means that the gate of the pre-charge transistor is at logical "0" (e.g., GND) and the gate-source voltage ($V_{GS}$) of the pre-charge transistor is zero. A CMOS process, utilizing metal-oxide-semiconductor field-effect-transistors (MOSFET), is typically used to implement pixel structures currently used in image sensors. With deep submicron CMOS technologies, the MOSFET drain current at $V_{GS}=0$ is not really zero and, therefore, a significant current leakage ($I_{off}$) can occur when the pre-charge transistor is off that results in the memorized voltage on the sample, or memory, capacitor Cmem leaking away. Such leakage current $I_{off}$ results in a loss of the stored information with even fA leakage potentially affecting the signal that is output to the column of the pixel array. As such, the pixel structure of FIG. 1B may not optimal for long (e.g., a fraction of a second or longer) memory times.

BRIEF DESCRIPTION OF THE DRAWINGS

The present invention is illustrated by way of example and not limitation in the figures of the accompanying drawings, in which.

DETAILED DESCRIPTION

A pixel structure having reduced leakage is described. In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines, and each of the single signal lines may alternatively be buses.

Figure 1A:
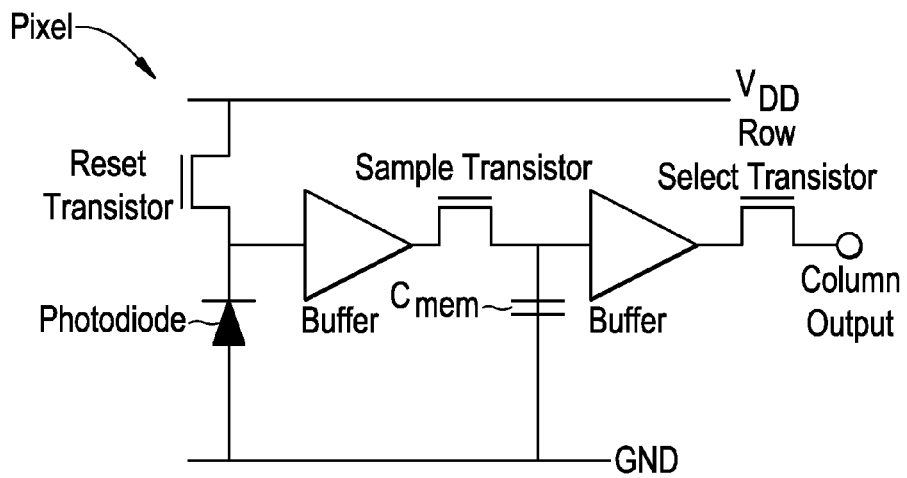
FIG. 1A illustrates one embodiment of a conventional pixel structure used within a synchronous shutter image sensor.
Figure 1B:
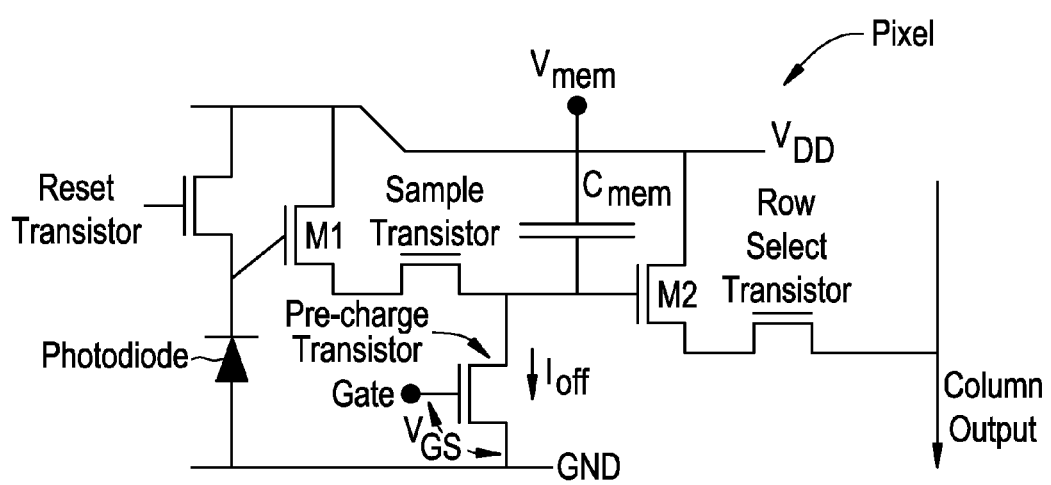
FIG. 1B illustrates one conventional circuit configuration of the synchronous pixel of FIG. 1A.
Figure 2:
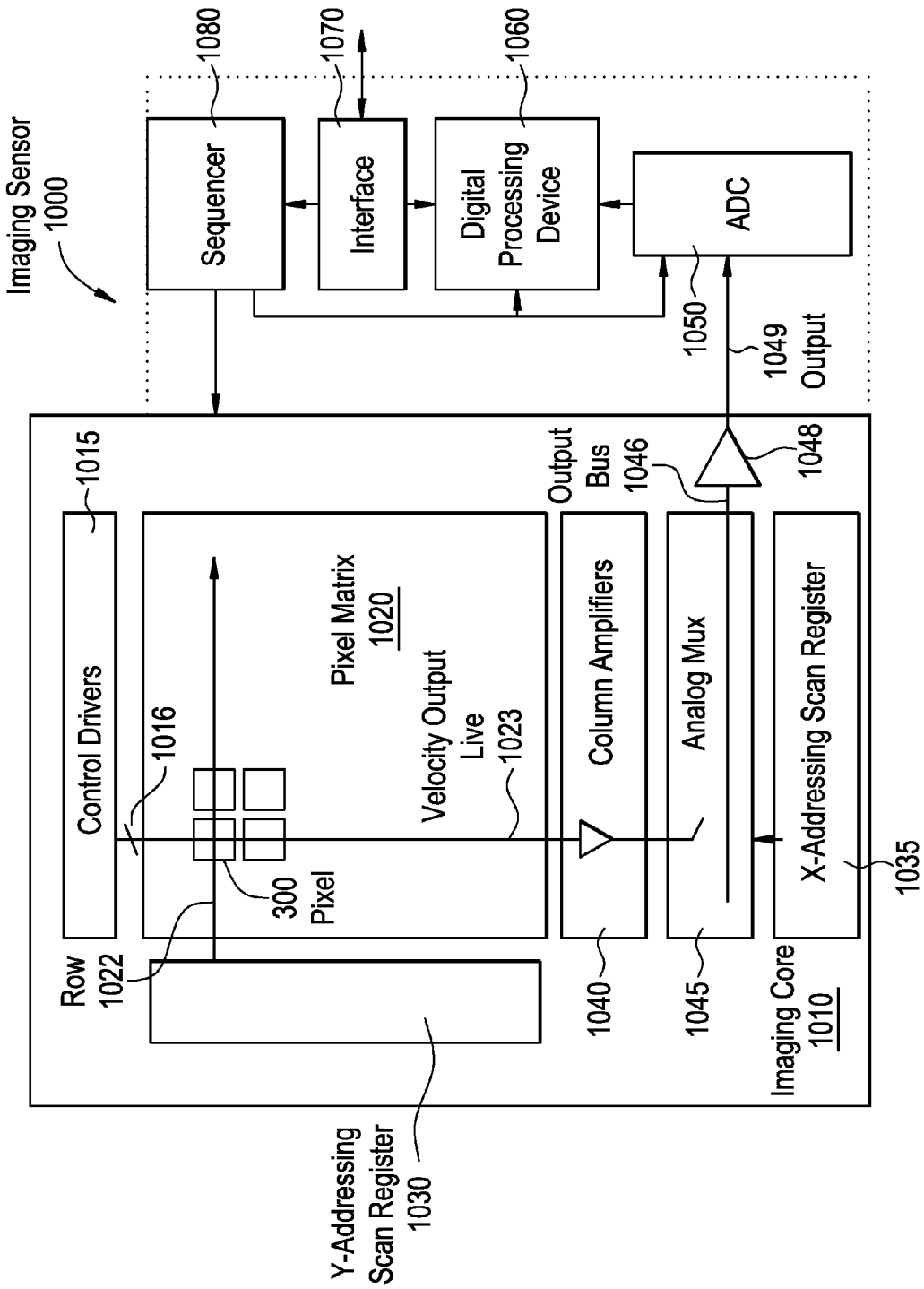
FIG. 2 illustrates an image sensor including a pixel according to one embodiment of the present invention.

FIG. 2 illustrates one embodiment of an image sensor implementing the methods and apparatus described herein. Image sensor 1000 includes an imaging core 1010 and components associated with the operation of the imaging core. The imaging core 1010 includes a pixel matrix 1020 having an array of pixels (e.g., pixel 300) and the corresponding driving and sensing circuitry for the pixel matrix 1020. The driving and sensing circuitry may include: one or more scanning registers 1035, 1030 in the X- and Y-direction in the form of shift registers or addressing registers; buffers/line drivers for the long reset and select lines; column amplifiers 1040 that may also contain fixed pattern noise (FPN) cancellation and double sampling circuitry; and analog multiplexer (mux) 1045 coupled to an output bus 1046. FPN has the effect that there is non-uniformity in the response of the pixels in the array. Correction of this non-uniformity needs some type of calibration, for example, by multiplying or adding/subtracting the pixel's signals with a correction amount that is pixel dependent. Circuits and methods to cancel FPN may be referred to as correlated double sampling or offset compensation and are known in the art; accordingly, a detailed description is not provided.

The pixel matrix 1020 may be arranged in N rows of pixels by N columns of pixels (with $N \geq 1$), with each pixel (e.g., pixel 300) is composed of at least a photosensitive element and a readout switch (not shown). A pixel matrix is known in the art; accordingly, a more detailed description is not provided.

The Y-addressing scan register(s) 1030 addresses all pixels of a row (e.g., row 1022) of the pixel matrix 1020 to be read out, whereby all selected switching elements of pixels of the selected row are closed at the same time. Therefore, each of the selected pixels places a signal on a vertical output line (e.g., line 1023), where it is amplified in the column amplifiers 1040. An X-addressing scan register(s) 1035 provides control signals to the analog multiplexer 1045 to place an output signal (amplified charges) of the column amplifiers 1045 onto output bus 1046. The output bus 1046 may be coupled to a buffer 1048 that provides a buffered, analog output 1049 from the imaging core 1010.

The output 1049 from the imaging core 1010 is coupled to an analog-to-digital converter (ADC) 1050 to convert the analog imaging core output 1049 into the digital domain. The ADC 1050 is coupled to a digital processing device 1060 to process the digital data received from the ADC 1050 (such processing may be referred to as imaging processing or post-processing). The digital processing device 1060 may include one or more general-purpose processing devices such as a microprocessor or central processing unit, a controller, or the like. Alternatively, digital processing device 1060 may include one or more special-purpose processing devices such as a digital signal processor (DSP), an application specific integrated circuit (ASIC), a field programmable gate array (FPGA), or the like. Digital processing device 1060 may also include any combination of a general-purpose processing device and a special-purpose processing device.

The digital processing device 1060 is coupled to an interface module 1070 that handles the information input/output (I/O) exchange with components external to the image sensor 1000 and takes care of other tasks such as protocols, handshaking, voltage conversions, etc. The interface module 1070 may be coupled to a sequencer 1080. The sequencer 1080 may be coupled to one or more components in the image sensor 1000 such as the imaging core 1010, digital processing device 1060, and ADC 1050. The sequencer 1080 may be a digital circuit that receives externally generated clock and control signals from the interface module 1070 and generates internal signals to drive circuitry in the imaging core 1010, ADC 1050, etc. In one embodiment, the voltage supplies that generate the control signals used to control the various components in the pixel structure of FIG. 2 discussed below may be generated by drivers illustrated by control drivers block 1015. In particular, control drivers 1015 may be coupled via control lines 1016 to the gates of the reset, sample and row select transistors in the pixel structure illustrated in FIG. 3 below. Drivers and voltage supplies are known in the art; accordingly, a more detailed description is not provided.

It should be noted that the image sensor illustrated in FIG. 2 is only an exemplary embodiment and an image sensor may have other configurations than that depicted in FIG. 2. For example, alternative embodiments of the image sensor 1000 may include one ADC 1050 for every pixel 300, for every column (i.e., vertical output line 1023), or for a subset block of columns. Similarly, one or more other components within the image sensor 1000 may be duplicated and/or reconfigured for parallel or serial performance. For example, a fewer number of column amplifiers 1040 than pixel matrix columns may be used, with column outputs of the pixel matrix multiplexed into the column amplifiers. Similarly, the layout of the individual components within the image sensor 1000 may be modified to adapt to the number and type of components. In another embodiment, some of the operations performed by the image sensor 1000 may be performed in the digital domain instead of the analog domain, and vice versa.

Figure 3:
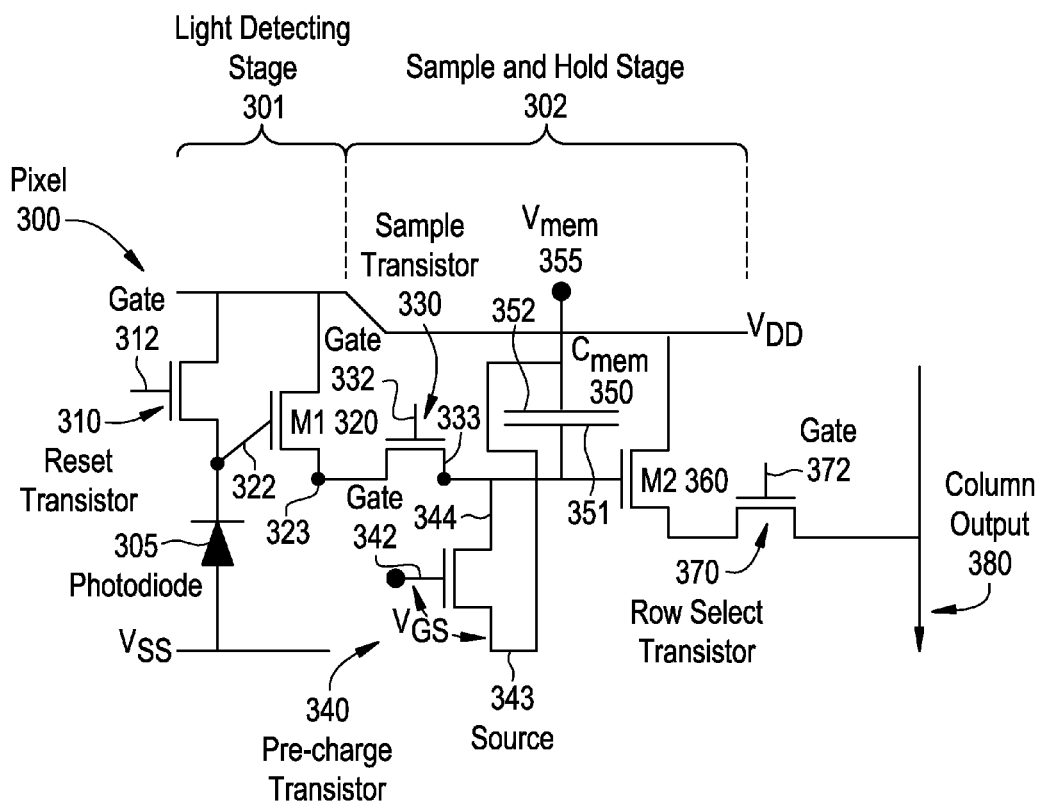
FIG. 3 illustrates a pixel structure according to one embodiment of the present invention.

FIG. 3 illustrates a pixel structure according to one embodiment of the present invention. In one embodiment, pixel 300 includes a light detecting stage 301 and a sample and hold stage 302. The light detecting stage 301 includes a photodiode 305, a reset transistor 310, and a source follower transistor M1 320. In this embodiment, the sample and hold stage 302 includes a sample transistor 330, a memory capacitor Cmem 350, a pre-charge transistor 340, and a source follower transistor M2 360 that operates as a buffer, or unity gain amplifier. The pixel 300 also includes a row select transistor 370 coupled to a column output 380 (e.g., output line 1023) of the pixel matrix 1020.

The reset transistor 310 of the light detecting stage 301 is used to reset the pixel to a high value using a voltage applied to gate 312. The corresponding voltage (i.e., the voltage on gate 312 minus a gate-to-source threshold voltage $V_T$ of reset transistor 310) applied to the gate 322 of the source follower transistor M1 starts dropping due to the photocurrent generated in the photodiode 305. The source follower transistor M1 320 operates as a unity gain amplifier to buffer the signal from the photodiode 305. The output (i.e., source) of transistor M1 320 is coupled to the sample and hold stage 302. The sample and hold stage 302 "sample" loads the voltage signal of source follower transistor M1 320, through the sample transistor 330, on the front plate 351 of memory capacitor Cmem 350. The voltage signal from the source 323 of the source follower transistor M1 320 will remain on the memory capacitor 350 when the sample transistor 330 is turned off. In one exemplary embodiment, Cmem may have a value approximately in a range of 20 to 100 fF. Alternatively, other values of Cmem may be used.

Before sample loading, a pre-charge transistor 340 is used to briefly unload the memory capacitor Cmem 350. The pre-charge transistor 340 is coupled between the source 333 of the sample transistor 330 and the back plate 352 of the memory capacitor 350. A voltage (Vmem) 355 is applied to the back plate 352 of Cmem 350. In one embodiment, Vmem may be a fixed voltage that is not zero. Alternatively, a varying voltage may be used to shift the voltage Vmem 355 on the memory node, so as to drive the source follower transistor M2 360 in a more suitable regime. As a source follower induces a downward voltage shift of one Vth, the useful input range at the gate of a source follower (i.e., M2 360. The signal level that is at the output of M1 is between (VDD−2*Vth) and zero (GND). As VDD is tends to become lower and lower in modern technologies, the following estimation may be made: VDD may be 1.8V, Vth may be 0.5V. Then, the output range of M1 is between 0 and 0.8 (1.8−2*0.5), and the input range of M2 is between 0.5 and 1.8. The overlap (i.e., the practical useful range) is thus from 0.5 to 0.8, which is very small. If we shift the M1 output range at least 0.5V up (to 0.5-1.3, or higher), a much larger overlap of the ranges is created: the whole M1 output range is now acceptable for M2. It should be noted that in other embodiments, the source follower transistor M2 360 may not be used or, alternatively, a non-unity gain amplifier may be used.

In this embodiment, the pre-charge transistor 340 is a MOSFET with its source 343 coupled to the back plate 352 of the memory capacitor 350. The pre-charge MOSFET 340 is operated in a fashion that it has a lower (i.e. negative) $V_{GS}$ with respect to the low supply voltage VSS node (e.g., ground) of the pixel 300. In this manner, the drain 344 current of the pre-charge MOSFET 340 is several orders of magnitude lower than with $V_{GS}=0$. This is realized by coupling the source 343 of the pre-charge transistor 340 to a slightly positive voltage compare to the gate 342. In one embodiment (not illustrated), this achieved by using a signal line that is coupled to the source 343 of the pre-charge transistor 340. However, the use of an additional (i.e., not otherwise used by the pixel structure) interconnection may be expensive in terms of requiring more dies area in which the pixel is implement. In one embodiment, VSS node is configured to receive the low supply voltage from outside of the pixel structure through the substrate (which may constitute the backside of the photodiode and/or the bulk of the n-channel MOSFETS) via the substrate potential. Alternatively, VSS node may be configured to receive the low supply voltage through a dedicated signal trace.

In the embodiment illustrated in FIG. 3, in order to obtain such a slightly positive (higher potential relative to the low supply voltage) source voltage available in the pixel, it is shared from the voltage Vmem 355 applied to the back plate 352 of the memory capacitor Cmem 350. More specifically, the source 343 of the pre-charge transistor 340 is coupled to Vmem 355 line that is coupled to the back plate of the memory capacitor Cmem 350. When the "pre-charge" signal is made low (i.e. inactive), during most of the time, the voltage Vmem 355 is made high, corresponding to the positive (or higher potential) source voltage. Hence, $V_{GS}<0$ and the pre-charge transistor 340 is more off (i.e., less or substantially no leakage current through the pre-charge transistor). In one embodiment, for example, a memory voltage 355 is applied such that $V_{GS}$ is approximately in a range of −0.3 to −0.4 volts. Alternatively, memory voltages may be used to generate other $V_{GS}$ voltages.

In one embodiment, six transistors may be used to implement the pixel structure described in regards to FIG. 3. Alternatively, other numbers of transistors may be used. For example, in this embodiment, the source follower transistor M1 320 and source follower transistor M2 360 operate as buffers or unity gain amplifiers. In an alternative embodiment, one or both of the source follower transistors M1 and M2 may be replaced by amplifiers having multiple transistors and may be non-unity gain amplifiers. In one embodiment, the voltages applied to the gate 312 of reset transistor 310, gate 322 of sample transistor 230, gate 372 of row select transistor 270 and the voltage Vmem 355 applied to the back plate 352 of Cmem 350 may be generated by drivers 1015 of FIG. 2.

Figure 4:
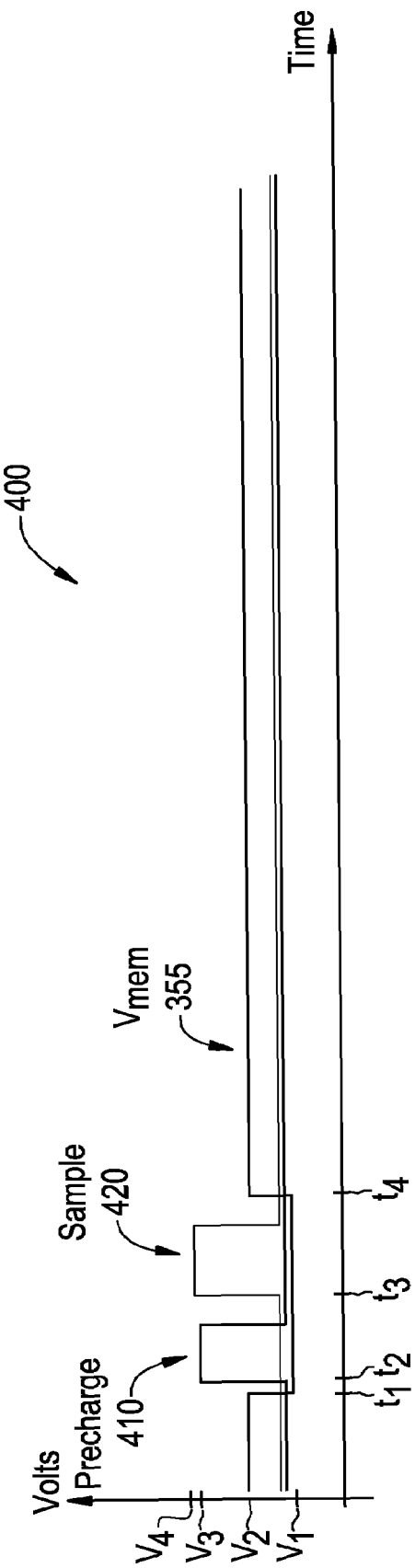
FIG. 4 is a timing diagram illustrating the timing corresponding to the operation of the pixel structure of FIG. 3.

FIG. 4 is a timing diagram illustrating the timing corresponding to the operation of the pixel of FIG. 3. The timing diagram 400 illustrates the timing relationship and relative voltages between the control signal voltage 410 applied to the gate 342 of pre-charge transistor 340; the control signal voltage 420 applied to the gate 322 of the sample transistor 330; and the control signal voltage Vmem 355 applied to the back plate 352 of the memory capacitor 350. In this embodiment, the analog memory of the pixel 300 (i.e., using Cmem) should sample the signal of an unbiased source follower (M1) 320. Before the S&H operation, the capacitor back plate 352 is brought to a low voltage $v_1$ (e.g., the low supply voltage such as ground or 0 volts) at time $t_1$. The Cmem capacitor 350 is, first, briefly discharged to that same low voltage by applying a turn-on voltage $v_3$ to the gate 342 of pre-charge transistor 340 at time $t_2$. After that, at time $t_3$, a turn-on voltage $v_4$ is applied to the gate 322 of the sample transistor 330 (that is in series between the source follower transistor 320 and the capacitor 350) briefly lets the source follower transistor M1 320 charge up the memory capacitor 350. Then, at time $t_4$, the capacitor back plate 352 is brought positive (e.g., 1 volt) to $v_2$ using Vmem 355, so as to make the $V_{GS}$ of the pre-charge transistor 340 negative. Thereby, the pre-charge transistor 340 shunts the memory capacitor 350. It should be noted that the transistor turn-on voltages in relation to the pixel supply voltages would be readily apparent to one of ordinary skill in the art; accordingly, a more detailed discussion is not provided.

An advantage to the pixel structures discussed above in regards to FIGS. 3 and 4 is that the hold time of the analog memory of pixel 300 may be improved by orders of magnitude over conventional pixel structures. In one embodiment, the pixel structure 300 discussed above in regards to FIG. 3 may provide a compact solution that does not resorting to an extra component or signal line inside the pixel. The described pixel configurations also have the beneficial effect that the Cmem capacitor 350 can be implemented as a poly on diffusion capacitor whereby the back plate 351 is the diffusion. The signal plate is, thus, not light sensitive, which is important in image sensors. The pixel structures discussed above in regards to FIGS. 3 and 4 may be used in image sensors requiring a high quality synchronous shutter.

As noted above, in an alternative embodiment, the pixel structure have other configurations to make $V_{GS}$ 341 of the pre-charge transistor 340 slightly negative with respect to the low supply voltage VSS (e.g., GND) of the pixel 300, for example, a physical line (i.e., trace) may be routed to the source 343 of the pre-charge transistor 340.

Although the low supply voltage VSS has been discussed at times in relation to a ground potential for ease of explanation, in alternative embodiment, other low supply voltage potentials may be used.

Another advantage to the pixel structure discussed herein is that there is a voltage level shift that brings the signal in a range that is more suitable for the source follower M2 360.

Embodiments of the present have been illustrated with MOS technology for ease of discussion. In alternative embodiments, other device types and process technologies may be used, for example, Bipolar and BiCMOS. It should be noted that the circuits described herein may be designed utilizing various voltages.

The image sensor and pixel structures discussed herein may be used in various applications including, but not limited to, a digital camera system, for example, for general-purpose photography (e.g., camera phone, still camera, video camera) or special-purpose photography (e.g., in automotive systems, hyperspectral imaging in space borne systems, etc). Alternatively, the image sensor and pixel structures discussed herein may be used in other types of applications, for example, machine and robotic vision, document scanning, microscopy, security, biometry, etc.

Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A method comprising:
    applying a first voltage to a back plate of a memory capacitor of a pixel to discharge the memory capacitor;
    pre-charging the memory capacitor in the pixel by applying the first voltage to a source of a pre-charge transistor while applying the first voltage to the back plate of the memory capacitor; and
    applying a second voltage to the back plate of the memory capacitor and the source of the pre-charge transistor,
        wherein the second voltage is at a higher potential than the first voltage to generate a negative gate-to-source voltage in the pre-charge transistor.

2. The method of claim 1, wherein the first voltage comprises a low supply voltage.

3. The method of claim 1, wherein the second voltage comprises a variable voltage.

4. A pixel, comprising:
    a memory capacitor having a back plate; and
    a pre-charge transistor coupled to the memory capacitor, the pre-charge transistor having a source,
        wherein a first voltage is applied to the back plate of the memory capacitor to discharge the memory capacitor,
        wherein the memory capacitor is pre-charged by applying the first voltage to the source of the pre-charge transistor while applying the first voltage to the back plate of the memory capacitor,
        wherein a second voltage is applied to the back plate of the memory capacitor and the source of the pre-charge transistor, and
        wherein the second voltage is at a higher potential than the first voltage to generate a negative gate-to-source voltage in the pre-charge transistor.

5. The apparatus of claim 4, further comprising means for generating the first voltage and the second voltage.

6. The pixel of claim 4, wherein the first voltage comprises a low supply voltage.

7. The pixel of claim 4, wherein the second voltage comprises a variable voltage.

8. The pixel of claim 4, comprising:
    a light detecting stage,
        wherein the light detecting stage comprises:
            a photodiode; and
            a reset transistor coupled to the photodiode; and
    a sample and hold stage,
        wherein the sample and hold stage comprises:
            the memory capacitor and the pre-charge transistor; and
            a sample transistor having a source coupled to the memory capacitor and the pre-charge transistor.

9. The pixel of claim 8, comprising:
    a first amplifier coupled between the photodiode and the sample transistor; and
    a second amplifier coupled between the capacitor and a row select transistor,
        wherein the row select transistor is coupled to the memory capacitor.

10. The pixel of claim 9, wherein the first amplifier comprises a first source follower transistor, and
    wherein the second amplifier comprises a second source follower transistor.

11. The pixel of claim 4, wherein the memory capacitor comprises a poly-diffusion capacitor.

12. The pixel of claim 11, wherein the back plate of the memory capacitor comprises the diffusion.

13. A synchronous shutter image sensor comprising a plurality of the pixels of claim 4.

* * * * *